United States Patent
Zhou et al.

(10) Patent No.: US 12,161,053 B2
(45) Date of Patent: Dec. 3, 2024

(54) SUPERCONDUCTING QUANTUM HYBRID SYSTEM, COMPUTER DEVICE, AND QUANTUM CHIP

(71) Applicant: TENCENT TECHNOLOGY (SHENZHEN) COMPANY LIMITED, Shenzhen (CN)

(72) Inventors: Yu Zhou, Shenzhen (CN); Zhenxing Zhang, Shenzhen (CN); Sainan Huai, Shenzhen (CN); Yarui Zheng, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 485 days.

(21) Appl. No.: 17/592,481

(22) Filed: Feb. 3, 2022

(65) Prior Publication Data

US 2022/0231215 A1 Jul. 21, 2022

Related U.S. Application Data

(63) Continuation of application No. PCT/CN2021/117254, filed on Sep. 8, 2021.

(30) Foreign Application Priority Data

Jan. 20, 2021 (CN) .......................... 202110073568.6

(51) Int. Cl.
*H10N 60/12* (2023.01)
*G06N 10/40* (2022.01)
(Continued)

(52) U.S. Cl.
CPC ............. *H10N 60/12* (2023.02); *G06N 10/40* (2022.01); *G06N 10/60* (2022.01); *H01P 7/06* (2013.01); *H10N 60/855* (2023.02)

(58) Field of Classification Search
None
See application file for complete search history.

(56) References Cited

U.S. PATENT DOCUMENTS

| | | | |
|---|---|---|---|
| 2020/0028486 A1 | 1/2020 | Kishino et al. |
| 2021/0209498 A1 | 7/2021 | Jin et al. |
| 2022/0207402 A1 | 6/2022 | Lechner |

FOREIGN PATENT DOCUMENTS

| | | | |
|---|---|---|---|
| CN | 107564868 A | 1/2018 |
| CN | 107564868 B | 8/2019 |

(Continued)

OTHER PUBLICATIONS

Khazen, Khashayar & von Bardeleben, H.J.. (2023). NV-centers in SiC: A solution for quantum computing technology?. Frontiers in Quantum Science and Technology. 2. 10.3389/frqst.2023.1115039. (Year: 2023).*

(Continued)

*Primary Examiner* — Alia Sabur
(74) *Attorney, Agent, or Firm* — ANOVA LAW GROUP PLLC

(57) ABSTRACT

A superconducting quantum hybrid system includes: a silicon carbide (SiC) epitaxial layer; and a superconducting qubit line, the superconducting qubit line corresponding to a superconducting qubit, where a designated region of the SiC epitaxial layer includes a nitrogen vacancy (NV) center, the NV center being formed by implanting nitrogen ions into the designated region of the SiC epitaxial layer, and where the superconducting qubit line is located on a surface of the SiC epitaxial layer, the superconducting qubit is coupled to a solid-state defect qubit, and the solid-state defect qubit is a qubit corresponding to the NV center in the designated region.

20 Claims, 7 Drawing Sheets

(51) Int. Cl.
 *G06N 10/60* (2022.01)
 *H01P 7/06* (2006.01)
 *H10N 60/85* (2023.01)

(56) References Cited

FOREIGN PATENT DOCUMENTS

| | | |
|---|---|---|
| CN | 110378482 A | 10/2019 |
| CN | 111260066 A | 6/2020 |
| CN | 111260068 A | 6/2020 |
| CN | 111382873 A | 7/2020 |
| CN | 111931940 A | 11/2020 |
| CN | 112215360 A | 1/2021 |
| JP | 2014215985 A | 11/2014 |
| JP | 2015167176 A | 9/2015 |
| JP | 2016042521 A | 3/2016 |
| JP | 2020156680 A1 | 8/2020 |
| WO | 2020180956 A1 | 9/2020 |

OTHER PUBLICATIONS

Abbasi Zargaleh, et al. (2018). Nitrogen vacancy center in cubic silicon carbide: A promising qubit in the 1.5Î¹/₄m spectral range for photonic quantum networks. Physical Review B. 98, 165203. (Year: 2018).*

Wang, Jun-Feng et al. (2020) Experimental Optical Properties of Single Nitrogen Vacancy Centers in Silicon Carbide at Room Temperature. ACS Photonics, 7, 1611-1616. (Year: 2020).*

China National Intellectual Property Administration (CNIPA) Office Action 1 for 202110073568.6 Apr. 22, 2022 9 Pages (including translation).

Qiang Li, "Preparation and quantum manipulation of color centers in silicon carbide," China Excellent Doctoral and Master's Thesis Full-text Database (Ph.D.) Basic Science Series, Jan. 15, 2021 (Jan. 15, 2021). 48 pages.

The World Intellectual Property Organization (WIPO) International Search Report for PCT/CN2021/117254 Dec. 7, 2021 7 Pages (including translation).

Ya-Rui Zheng et al., "Creating nitrogen-vacancy ensembles in diamond for coupling with flux qubit," Chin. Phys. B, vol. 26, No. 2, 020305, Jan. 10, 2017 (Jan. 10, 2017). 5 pages.

Tom Douce et al., "Coupling a single nitrogen-vacancy center to a superconducting flux qubit in the far-off-resonance regime," Physical Review A 92, 052335, Nov. 10, 2017 (Nov. 10, 2017). 8 pages.

David P. Divincenzo, "The Physical Implementation of Quantum Computation," arXiv:quant-ph/0002077, Apr. 13, 2000. 9 pages.

X. Zhu et al., "Coherent coupling of a superconducting flux qubit to an electron spin ensemble in diamond," Nature, vol. 478, issue 7368, pp. 221-224, 2011. 4 pages.

Y. Kubo et al., "Hybrid quantum circuit with a superconducting qubit coupled to a spin ensemble," Physical Review Letters 107, 220501, 2011. 5 pages.

J. F. Wang et al., "Coherent control of nitrogen-vacancy center spins in silicon carbide at room temperature," Physical Review Letters 124, 223601, 2020. 6 pages.

D. Marcos et al., "Coupling nitrogen-vacancy centers in diamond to superconducting flux qubits," Physical Review Letters 105, 210501, 2010. 4 pages.

Z. L. Xiang et al., "Hybrid quantum circuits: Superconducting circuits interacting with other quantum systems," Reviews of Modern Physics, vol. 85, 2013. 31 pages.

Y. Hu et al., "Quantum interface between a transmon qubit and spins of nitrogen-vacancy centers," Physical Review A, 96(6), 062301, 2017. 24 pages.

Frank Arute et al., "Quantum supremacy using a programmable superconducting processor," Nature, vol. 574, pp. 505-510, Oct. 24, 2019. 6 pages.

The European Patent Office (EPO) the Extended European Search Report for 21854663.8 Jul. 20, 2023 8 Pages.

Atature Mete et al:"Material platforms for spin-based photonic quantum technologies", Nature Reviews Materials, Nature Publishing Group UK London vol. 3, No. 5, Apr. 30, 2018 (Apr. 30, 2018), pp. 38-51.

The Japan Patent Office (JPO) Notification of Reasons for Refusal for Application No. 2022-513858 and Translation May 31, 2023 5 Pages.

* cited by examiner (401)          (402)

SUPERCONDUCTING QUANTUM HYBRID SYSTEM, COMPUTER DEVICE, AND QUANTUM CHIP

RELATED APPLICATION(S)

This application is a continuation application of PCT Patent Application No. PCT/CN2021/117254 filed on Sep. 8, 2021, which claims priority to Chinese Patent Application No. 202110073568.6, entitled "SUPERCONDUCTING QUANTUM HYBRID SYSTEM AND COMPUTER DEVICE" filed on Jan. 20, 2021, all of which are incorporated by reference in entirety.

FIELD OF THE TECHNOLOGY

The present disclosure relates to the field of quantum computing, and in particular, to a superconducting quantum hybrid system, a computer device, and a quantum chip.

BACKGROUND

A quantum computer is a computer operating according to principles of quantum computing. A difference between the quantum computer and a classical computer is that, the quantum computer can have a powerful parallel processing capability by using the superposition principle and the characteristic of quantum entanglement.

Based on different physical systems, the researchers have put forward different ideas for the quantum computer, including a superconducting qubit based on a Josephson junction. The superconducting qubit is a multi-energy-level system constructed by using such a core element as the Josephson junction (which is equivalent to a nonlinear inductor in a harmonic oscillator), and the superconducting qubit constructed by using the Josephson junction is expandable and may be coupled into a multi-qubit, to achieve the quantum computing.

In the above solution, the superconducting qubit constructed based on the Josephson junction has poor coherence, and has a shorter coherence time. Therefore, it is often difficult to achieve an effective number of quantum computing operations within the coherence time.

SUMMARY

Embodiments of the present disclosure provide a superconducting quantum hybrid system, a computer device, and a quantum chip, which can enable a superconducting qubit with a short coherence time to store information into a solid-state defect qubit with a long coherence time, so that a decoherence time of the information is increased, and an effective number of quantum computing operations are easier to achieve within the coherence time. The technical solutions are as follows:

In one aspect, the present disclosure provides a superconducting quantum hybrid system, including: a silicon carbide (SiC) epitaxial layer; and a superconducting qubit line, the superconducting qubit line corresponding to a superconducting qubit, where a designated region of the SiC epitaxial layer includes a nitrogen vacancy (NV) center, the NV center being formed by implanting nitrogen ions into the designated region of the SiC epitaxial layer, and where the superconducting qubit line is located on a surface of the SiC epitaxial layer, the superconducting qubit is coupled to a solid-state defect qubit, and the solid-state defect qubit is a qubit corresponding to the NV center in the designated region.

In another aspect, the present disclosure provides a quantum chip, the quantum chip includes a superconducting quantum hybrid system, and the superconducting quantum hybrid system includes: a silicon carbide (SiC) epitaxial layer; and a superconducting qubit line, the superconducting qubit line corresponding to a superconducting qubit, where a designated region of the SiC epitaxial layer includes a nitrogen vacancy (NV) center, the NV center being formed by implanting nitrogen ions into the designated region of the SiC epitaxial layer, and where the superconducting qubit line is located on a surface of the SiC epitaxial layer, the superconducting qubit is coupled to a solid-state defect qubit, and the solid-state defect qubit is a qubit corresponding to the NV center in the designated region.

In yet another aspect, the present disclosure provides a computing device, the computing device includes a superconducting quantum hybrid system, and the superconducting quantum hybrid system includes: a silicon carbide (SiC) epitaxial layer; and a superconducting qubit line, the superconducting qubit line corresponding to a superconducting qubit, where a designated region of the SiC epitaxial layer includes a nitrogen vacancy (NV) center, the NV center being formed by implanting nitrogen ions into the designated region of the SiC epitaxial layer, and where the superconducting qubit line is located on a surface of the SiC epitaxial layer, the superconducting qubit is coupled to a solid-state defect qubit, and the solid-state defect qubit is a qubit corresponding to the NV center in the designated region.

The technical solutions provided in the embodiments of the present disclosure may include the following beneficial effects:

In the superconducting quantum hybrid system, the NV center is formed in the designated region of the SiC epitaxial layer by the ion implantation, and the solid-state defect qubit corresponding to the NV center is coupled to the superconducting qubit corresponding to the superconducting qubit line. Through the above solution, the ion implantation by which the NV center is formed can control the positions and number of formed NV centers, to help control the coupling between the solid-state defect qubit corresponding to the NV center and the superconducting qubit corresponding to the superconducting qubit line. In this way, a superconducting qubit with a short coherence time is easier to achieve quantum state exchange with a solid-state defect qubit with a long coherence time, that is, the superconducting qubit with the short coherence time can store information into the solid-state defect qubit with the long coherence time, so that the decoherence time of the information is increased, and the effective number of quantum computing operations are easier to achieve within the coherence time.

The foregoing general descriptions and the following detailed descriptions are only exemplary, and cannot limit the present disclosure.

BRIEF DESCRIPTION OF THE DRAWINGS

To facilitate a better understanding of technical solutions of certain embodiments of the present disclosure, accompanying drawings are described below. The accompanying drawings are illustrative of certain embodiments of the present disclosure, and a person of ordinary skill in the art may still derive other drawings from these accompanying drawings without having to exert creative efforts. When the following descriptions are made with reference to the accompanying drawings, unless otherwise indicated, same numbers in different accompanying drawings may represent same or similar elements. In addition, the accompanying drawings are not necessarily drawn to scale.

DETAILED DESCRIPTION

Figure 1:
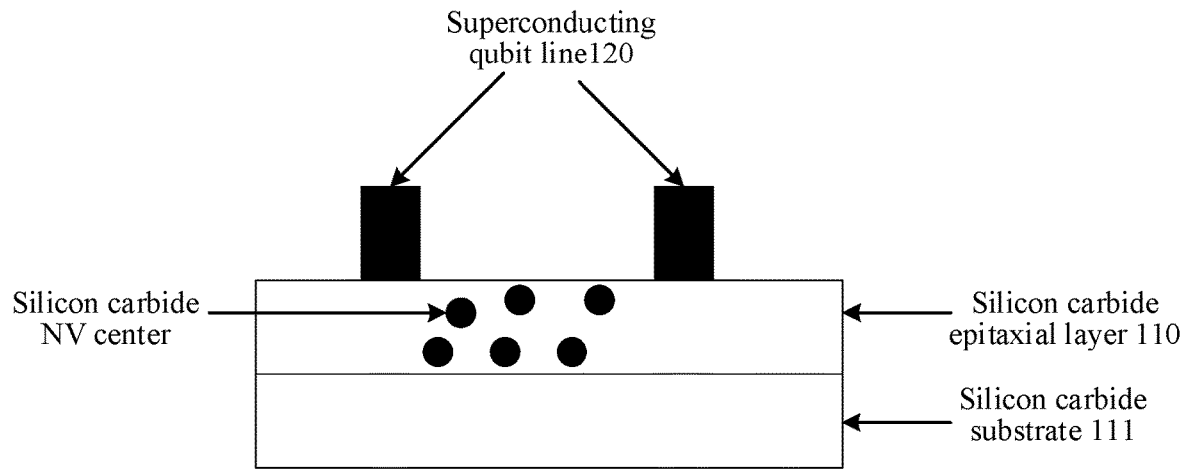
FIG. 1 is a schematic diagram of a vertical cross section of a superconducting quantum hybrid system according to certain embodiment(s) of the present disclosure.

To make objectives, technical solutions, and/or advantages of the present disclosure more comprehensible, certain embodiments of the present disclosure are further elaborated in detail with reference to the accompanying drawings. The embodiments as described are not to be construed as a limitation to the present disclosure. All other embodiments obtained by a person of ordinary skill in the art without creative efforts shall fall within the protection scope of embodiments of the present disclosure.

Throughout the description, and when applicable, "some embodiments" or "certain embodiments" describe subsets of all possible embodiments, but it may be understood that the "some embodiments" or "certain embodiments" may be the same subset or different subsets of all the possible embodiments, and can be combined with each other without conflict.

In certain embodiments, the term "based on" is employed herein interchangeably with the term "according to."

It is to be understood that in the present disclosure, "several" means one or more, and "plurality of" means two or more. "And/or" describes an association relationship for associated objects and represents that three relationships may exist. For example, A and/or B may represent the following three embodiments: only A exists, both A and B exist, and only B exists. The character "/" in this specification generally indicates an "or" relationship between the associated objects.

For convenience of understanding, related terms in the embodiments of the present disclosure are described below.

1) Superconducting Qubit

The superconducting qubit is a quantum two-energy-level system taking quantum mechanics as a theoretical basis and a Josephson junction as a basic carrier. The superconducting qubit has advantages such as compatibility with certain existing microelectronic processing technology, controllability, low loss, and scalability. Therefore, the solution is one of promising solutions for achieving the quantum computer. Compared with the logical operation and computational processing between classical bits, and it can be known from the third condition that a physical carrier for achieving the quantum computer may need to meet that, achieving coherence between controllable qubits and a decoherence time is a desirable condition for achieving the quantum computer.

2) Nitrogen Vacancy Center

The nitrogen vacancy (NV) center is a type of luminous point defect in diamond or silicon carbide (SiC). A nitrogen atom replaces a carbon atom in the diamond, and there is a vacancy at an adjacent position. Such a point defect is referred to as the NV center (or the NV-center). The NV center presents stronger fluorescence under the pumping of a laser (such as a laser with a wavelength of 532 nm), and a zero-phonon line of the NV center can be observed at room temperature. Because the fluorescence of the NV center is stable and is a good single-photon source, the NV center is used in experiments such as quantum key distribution and biofluorescence labeling. A spin of the NV center can be manipulated and detected by a laser and a microwave. However, the diamond has a fluorescence range of 1000 nm-1400 nm, and therefore is not suitable to serve as a substrate for processing of a superconducting quantum chip. An NV center in the SiC can be excited by a laser of 800 nm-900 nm, a zero-field component D of the NV center in the SiC is generally at 1.33 GHz, and fluorescence of the NV center in the SiC belongs to a communication band. This quantum hybrid system helps the final achievement of a photon-superconducting qubit quantum network. In addition, because a coherence time of an electron spin of the NV center may reach an order of milliseconds, the system is considered as a desirable quantum computer system. Experiments such as a quantum register and quantum error correction by using the NV center have been verified. Meanwhile, the NV center may also be used as a nanometer-sized sensor, configured to measure physical quantities such as a magnetic field, an electric field, and a temperature.

3) Spin

The spin is an intrinsic motion caused by an intrinsic angular momentum of a particle. In quantum mechanics, the spin is an intrinsic property of a particle, and an operational rule thereof is similar to the angular momentum of classical mechanics. Therefore, a magnetic field is generated. Although the spin is sometimes analogous to the rotation (for example, the rotation of a planet when revolving) in classical mechanics, the essence is actually quite different. The spin is regarded as an inherent property, and is a type of angular momentum that a particle is born with, and a magnitude thereof is quantized and cannot be changed. A particle with a half-integer spin is referred to as a fermion, which obeys Fermi-Dirac statistics. A particle with a non-negative integer spin is referred to as a boson, which obeys Bose-Einstein statistics.

4) Hamiltonian

The Hamiltonian is a sum of the kinetic energy of all particles plus the potential energy of the particles related to a system. For particles with a different situation or number, the Hamiltonian is different because the Hamiltonian includes the sum of the kinetic energy of the particles and a potential energy function corresponding to this situation. In quantum mechanics, the Hamiltonian of the particles can be read out by the Hamiltonian acting on energy eigenstates of the particles. The Hamiltonian H is an observable corresponding to the total energy of the system. Like all other operators, a spectrum of the Hamiltonian is a set of possible results when measuring the total energy of the system.

FIG. 1 is a schematic diagram of a vertical cross section of a superconducting quantum hybrid system according to an exemplary embodiment. As shown in FIG. 1, the superconducting quantum hybrid system includes: a SiC epitaxial layer 110 and a superconducting qubit line 120.

SiC is a compound formed by a carbon (C) element and a silicon (Si) element. 4H—SiC of a hexagonal structure has advantages of high critical breakdown electric field and high electron mobility. The 4H—SiC is an excellent semiconductor material for manufacturing power semiconductor devices with high voltage and high temperature resistance and radiation-resistance, and is also the third-generation semiconductor material with the best comprehensive performance, the highest degree of commercialization, and the most mature technology currently. In the embodiments of the present disclosure, the 4H—SiC may be preferably used.

Different from certain existing Si power device manufacturing process, SiC power devices cannot be directly fabricated on SiC single-crystal materials. It is desirable to additionally grow high-quality epitaxial materials on conductive single-crystal substrates, that is, through chemical vapor deposition and other epitaxial technologies, a high-precision SiC epitaxial layer 110 is grown on a SiC substrate 111 shown in FIG. 1, and various devices are manufactured on the SiC epitaxial layer 110.

A designated region of the SiC epitaxial layer includes an NV center, the NV center being formed by implanting nitrogen ions into the SiC epitaxial layer of the designated region.

In certain embodiment(s), the nitrogen ions may be implanted into the SiC epitaxial layer of the designated region by ion implantation, and the NV center is generated in the SiC epitaxial layer of the designated region.

The superconducting qubit line is located on a surface of the SiC epitaxial layer, and the superconducting qubit line corresponds to a superconducting qubit. The superconducting qubit is coupled to a solid-state defect qubit. The solid-state defect qubit is a qubit corresponding to the NV center in the designated region.

The superconducting qubit line may include a molecular beam epitaxy (MBE) aluminum film and a Josephson junction, the superconducting qubit line is located on the surface of the SiC epitaxial layer, and the designated region of the SiC epitaxial layer includes the NV center. The superconducting qubit corresponding to the superconducting qubit line may be coupled to the solid-state defect qubit corresponding to the NV center in the designated region. The designated region may be a region in the SiC epitaxial layer corresponding to the superconducting qubit line.

In the technical solutions shown in the embodiments of the present disclosure, in the superconducting quantum hybrid system, the NV center is formed in the designated region of the SiC epitaxial layer by the ion implantation, and the solid-state defect qubit corresponding to the NV center is coupled to the superconducting qubit corresponding to the superconducting qubit line. Through the above solution, the ion implantation by which the NV center is formed can control the positions and number of formed NV centers, to help control the coupling between the solid-state defect qubit corresponding to the NV center and the superconducting qubit corresponding to the superconducting qubit line. In this way, a superconducting qubit with a short coherence time is easier to achieve quantum state exchange with a solid-state defect qubit with a long coherence time, that is, the superconducting qubit with the short coherence time can store information into the solid-state defect qubit with the long coherence time, so that the decoherence time of the information is increased, and the effective number of quantum computing operations are easier to achieve within the coherence time.

Figure 2:
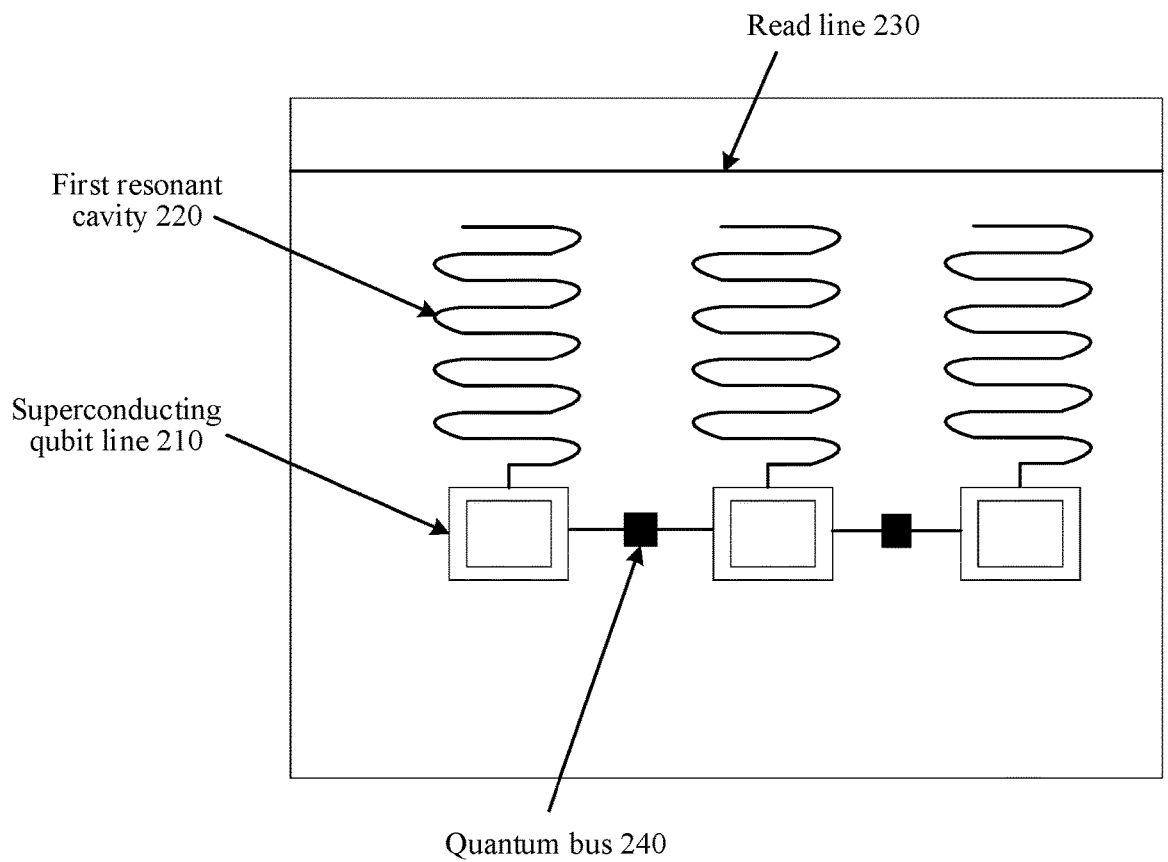
FIG. 2 is a schematic diagram of an upper surface of a superconducting quantum hybrid system according to certain embodiment(s) of the present disclosure.

Based on the superconducting quantum hybrid system shown in FIG. 1, FIG. 2 is a schematic diagram of an upper surface of a superconducting quantum hybrid system according to an exemplary embodiment. As shown in FIG. 2, the surface of the superconducting quantum hybrid system includes: a superconducting qubit line 210, a first resonant cavity 220, a read line 230, and a quantum bus 240.

In certain embodiment(s), the superconducting qubit line 210, the first resonant cavity 220, the read line 230, and the quantum bus 240 in the superconducting quantum hybrid system are located on a surface of a SiC epitaxial layer.

In certain embodiment(s), a superconducting qubit corresponding to the superconducting qubit line may be any one of a superconducting flux qubit, a superconducting charge qubit, a superconducting transmon qubit, and a superconducting phase qubit.

Figure 3:
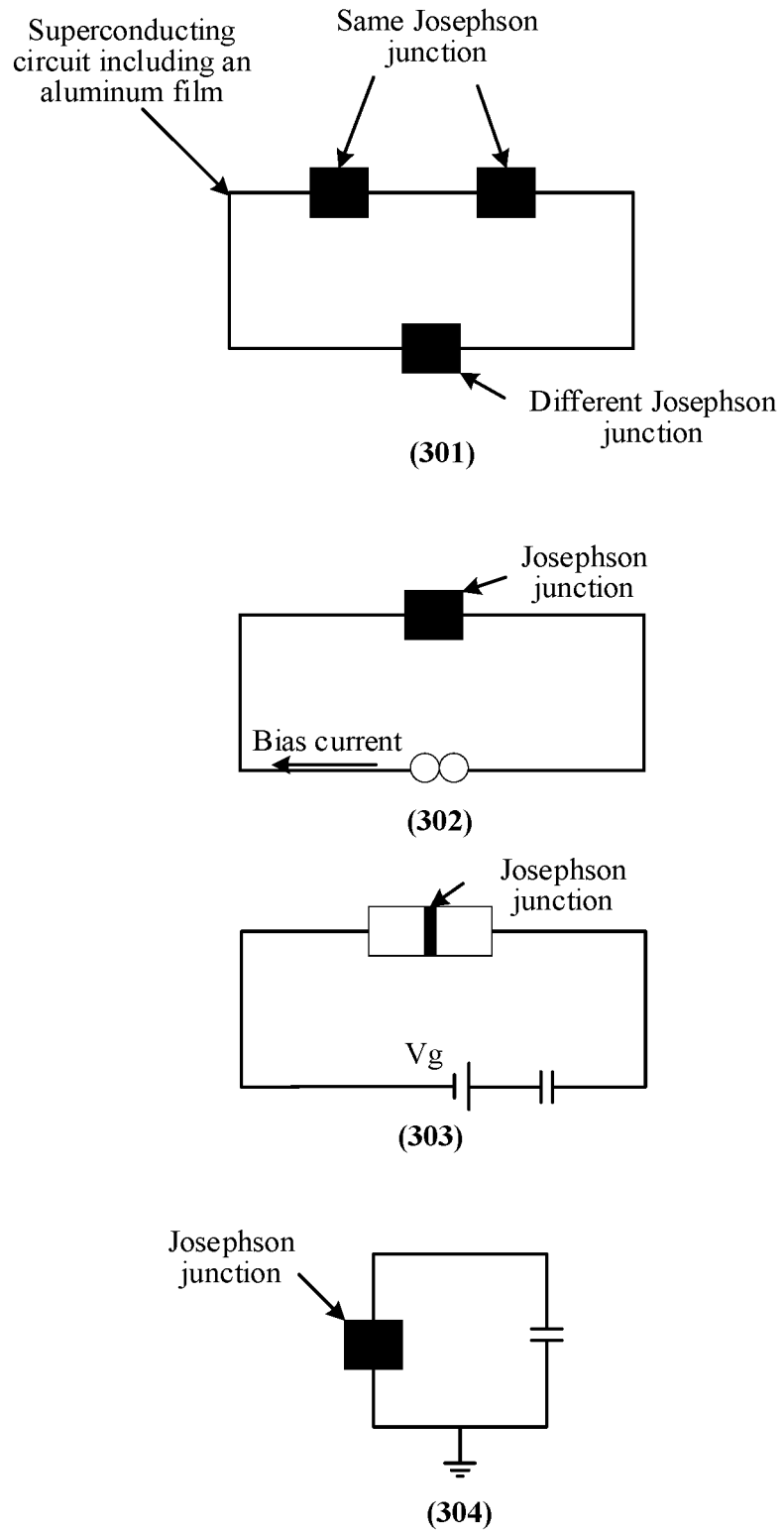
FIG. 3 is schematic diagrams of superconducting qubit lines corresponding to different superconducting qubits referenced in FIG. 2 according to certain embodiment(s) of the present disclosure.

FIG. 3 shows schematic diagrams of superconducting qubit lines corresponding to different superconducting qubits according to an embodiment of the present disclosure. A part 301 in FIG. 3 is a superconducting qubit line corresponding to a superconducting flux qubit, and a core region thereof includes three Josephson junctions connected through a superconducting line. The superconducting flux qubit constructs, through two identical Josephson junctions (such as a first type of Josephson junction with Josephson energy $E_J$) and another Josephson junction (such as a second type of Josephson junction with Josephson energy $aE_J$) different from the first two Josephson junctions, a two-energy-level system which can adjust f10 (that is, an energy level difference between a first excited state and a ground state) by adjusting a flux. A superconducting quantum line including the three Josephson junctions and the superconducting line corresponds to the ground state and the first excited state, and the ground state and the first excited state of the superconducting quantum line are respectively used as $|0\rangle$ state and a $|1\rangle$ state of the superconducting qubit.

A part 302 in FIG. 3 is a superconducting qubit line corresponding to a superconducting phase qubit, that is, a voltage bias is applied to a Josephson junction. In the superconducting qubit line, a potential barrier height of the Josephson junction may be conveniently adjusted by a bias current I applied to the Josephson junction, for example, the bias current may be adjusted so that a potential well including a potential barrier has only two lowest energy eigenstates, and the two lowest energy eigenstates are used as a $|0\rangle$ state and a $|1\rangle$ state of the superconducting qubit. In actual implementations, a specific flux bias may also be added to the superconducting phase qubit to which the voltage bias is being added, to form a superconducting qubit with flux phase hybridization, to facilitate subsequent reading of the superconducting qubit.

A part 303 in FIG. 3 is a superconducting qubit line corresponding to a superconducting charge qubit, that is, through a superconductor with n excess cooper pairs, also referred to as cooper-pair box, a Josephson junction, and a capacitor plus a gate voltage Vg, the number of electron pairs on the cooper-pair box is controlled. States describing the number of electrons on the cooper-pair box may be used as a |0> state and a |1> state of the superconducting qubit.

A part 304 in FIG. 3 is a superconducting qubit line corresponding to a superconducting transmon qubit. A Josephson junction adds a thinner insulator to a superconductor. Therefore, superconductors located on both sides of the insulator are close, cooper pairs distributed on the both sides of the insulator may be coupled to each other, and wave functions thereof may be associated. Due to the tunneling effect, the cooper pairs may pass through a potential barrier formed by the thinner insulator, so that the cooper pairs flow between the two superconductors to form a superconducting current. When the superconducting current flows through the Josephson junction, a specific energy may be stored in the junction similar to an inductor. The Josephson junction is used to replace the inductor to connect to an inductor-capacitor (LC) oscillator, and then a transmon qubit is composed. By solving the energy stored by the Josephson junction as the inductor in a circuit, a Hamiltonian of the system is obtained, to obtain two lowest points of oscillation of the LC oscillator as a |0> state and a |1> state of the superconducting qubit.

The system further includes a first resonant cavity 220, and the first resonant cavity 220 is coupled to the superconducting qubit line 210.

In certain embodiment(s), the first resonant cavity is coupled to the superconducting qubit line at a designated position. The designated position is determined according to a type of the superconducting qubit line.

The superconducting flux qubit and the superconducting phase qubit are more sensitive to a magnetic field. Therefore, when the superconducting qubit is the superconducting flux qubit or the superconducting phase qubit, the designated position is a center of the resonant cavity. That is, the superconducting qubit may need to be coupled to the resonant cavity at the center of the resonant cavity (that is, a voltage wave junction of the resonant cavity, at which the magnetic field is the largest), so that coupling strength between the superconducting qubit and the resonant cavity is maximized.

When the superconducting qubit is the superconducting charge qubit or the superconducting transmon qubit, the designated position is both sides of the resonant cavity. That is, the superconducting qubit may need to be coupled to the resonant cavity at the both sides of the resonant cavity (that is, a voltage wave loop of the resonant cavity, at which the electric field is the largest), so that coupling strength between the superconducting qubit and the resonant cavity is maximized.

In certain embodiment(s), the first resonant cavity 220 is directly coupled to the superconducting qubit line 210 through a capacitor between the first resonant cavity and the superconducting qubit line at the designated position.

The capacitor between the first resonant cavity and the superconducting qubit line is an equivalent capacitor between the first resonant cavity and the superconducting qubit line. That is, the first resonant cavity and the superconducting qubit line on the SiC epitaxial layer may be coupled to each other through the equivalent capacitor between the first resonant cavity and the superconducting qubit line.

When the first resonant cavity is coupled to the superconducting qubit line, an energy of the first resonant cavity and an energy of a superconducting qubit corresponding to the superconducting qubit line affect each other. That is, after the first resonant cavity is coupled to the superconducting qubit line, the first resonant cavity and the superconducting qubit line compose a coupling system. In the coupling system, a natural frequency of the first resonant cavity may have a specific offset, and the offset is related to a state of the superconducting qubit. Therefore, the state of the superconducting qubit may be determined according to a frequency offset of the first resonant cavity, to read the superconducting qubit.

The system further includes a read line 230, and the read line 230 is coupled to the first resonant cavity through a first capacitor or a first inductor.

The read line 230 may be coupled to the first resonant cavity through the first capacitor or the first inductor. The offset of the natural frequency of the first resonant cavity is obtained according to a signal fed back by the read line, to determine an energy level of the superconducting qubit coupled to the first resonant cavity and read the superconducting qubit.

Figure 4:
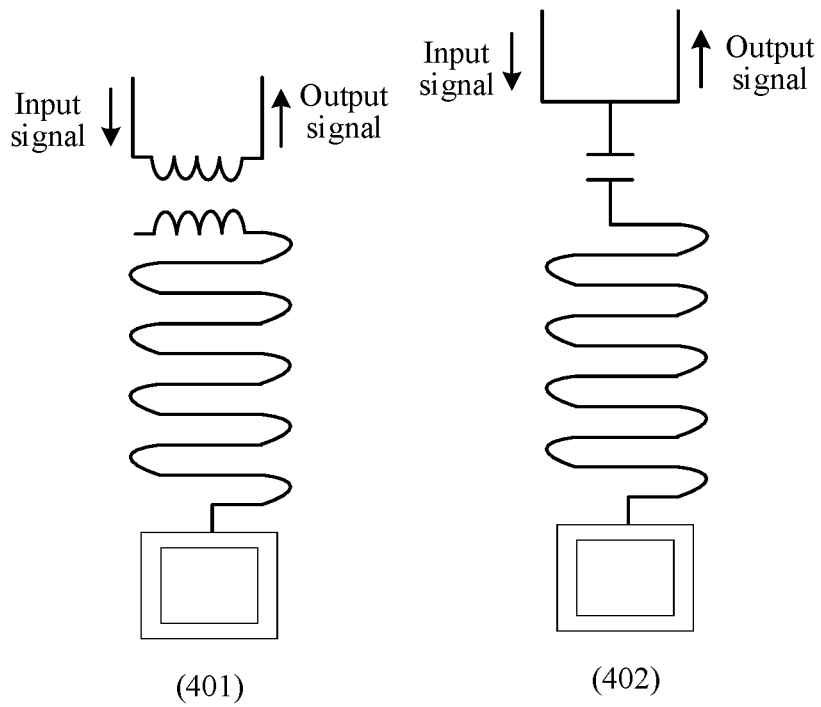
FIG. 4 is a schematic diagram of reading of a resonant cavity referenced in FIG. 2 according to certain embodiment(s) of the present disclosure.

FIG. 4 is a schematic diagram of reading of a resonant cavity according to an embodiment of the present disclosure. A part 401 in FIG. 4 is a schematic diagram of the read line being coupled to the first resonant cavity through a first inductor. A side of the read line transmits an input signal to the first inductor, and obtains an output signal after the input signal passes through the first inductor coupled to the resonant cavity. A frequency of the first resonant cavity at this moment may be obtained according to an amplitude difference and/or a phase difference between the input signal and the output signal.

Similarly, a part 402 in FIG. 4 is a schematic diagram of the read line being coupled to the first resonant cavity through a first capacitor. A side of the read line transmits an input signal to the first capacitor, and obtains an output signal after the input signal passes through the first capacitor coupled to the resonant cavity. A frequency of the first resonant cavity at this moment may be obtained according to an amplitude difference and/or a phase difference between the input signal and the output signal.

A state of the superconducting qubit coupled to the first resonant cavity may be determined according to the frequency of the first resonant cavity at this moment and the offset of the natural frequency of the first resonant cavity.

In certain embodiment(s), the superconducting quantum hybrid system may include only one superconducting qubit line, the superconducting quantum hybrid system has a designated region corresponding to the superconducting qubit line, and a superconducting qubit corresponding to the superconducting qubit line is coupled to a solid-state defect qubit corresponding to an NV center in the designated region.

In certain embodiment(s), the superconducting quantum hybrid system may include at least two superconducting qubit lines, and the at least two superconducting qubit lines are coupled through a quantum bus 240.

That is, the superconducting quantum hybrid system may include superconducting qubits corresponding to the at least two superconducting qubit lines, and the superconducting qubits may be the same type of superconducting qubits, for example, some or all of the superconducting qubits are superconducting flux qubits; or the superconducting qubits may be different types of superconducting qubits, that is, the at least two superconducting qubit lines may be superconducting qubit lines corresponding to different types of superconducting qubits.

In certain embodiment(s), the quantum bus includes at least one of a second capacitor, a second inductor, and a second resonant cavity.

When a plurality of superconducting qubit lines achieve coupling between superconducting qubits, the plurality of superconducting qubit lines may be coupled through a plurality of quantum buses.

In certain embodiment(s), the plurality of quantum buses may be the same type of quantum bus, for example, some or all of the plurality of quantum buses may be the second capacitor, some or all of the plurality of quantum buses may be the second inductor, or some or all of the plurality of quantum buses may be the second resonant cavity.

In certain embodiment(s), the plurality of quantum buses may be different types of quantum buses, for example, the plurality of quantum buses may be at least two of the second capacitor, the second inductor, and the second resonant cavity.

In certain embodiment(s), the quantum bus may be determined according to a superconducting qubit line connected to the quantum bus. For example, to ensure the coupling strength, for a superconducting flux qubit, a superconducting charge qubit, a superconducting transmon qubit, and a superconducting phase qubit, different types of quantum buses may be selected to achieve coupling among the different types of superconducting qubits in a superconducting quantum hybrid system.

A designated region of the SiC epitaxial layer includes an NV center, the NV center being formed by implanting nitrogen ions into the SiC epitaxial layer of the designated region. A superconducting qubit corresponding to the superconducting qubit line is coupled to a solid-state defect qubit corresponding to the NV center in the designated region.

In certain embodiment(s), the number of NV centers of the designated region is determined according to concentration of nitrogen ions implanted into the SiC epitaxial layer of the designated region.

Figure 5:
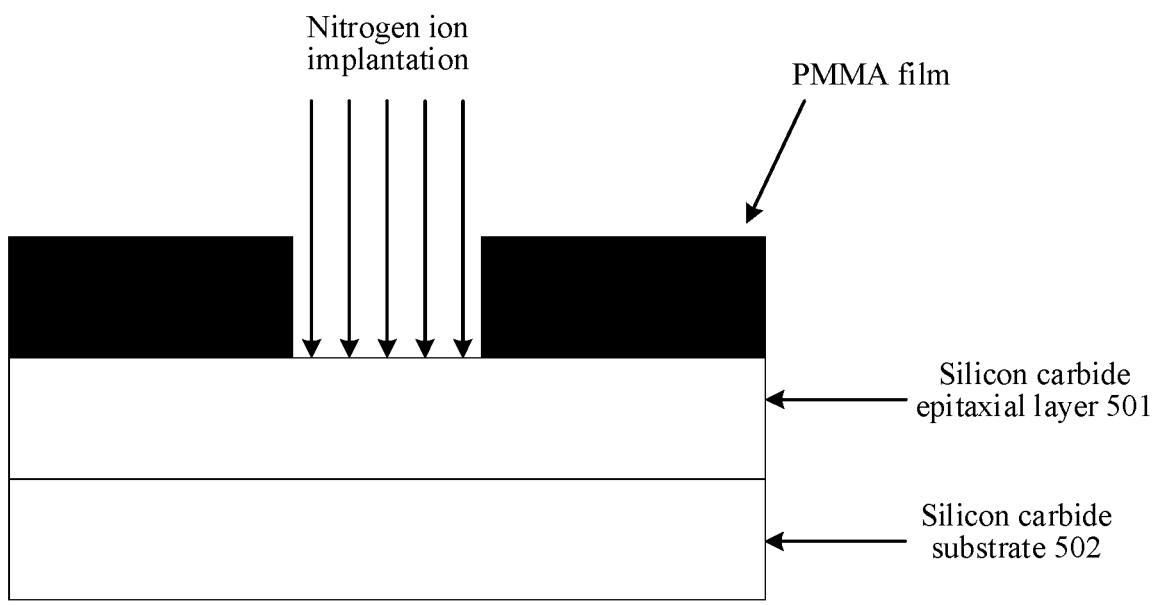
FIG. 5 is a schematic diagram of nitrogen ions being implanted into a silicon carbide (SiC) epitaxial layer referenced in FIG. 2 according to certain embodiment(s) of the present disclosure.

FIG. 5 shows a schematic diagram of nitrogen ions being implanted into a SiC epitaxial layer according to an embodiment of the present disclosure. As shown in FIG. 5, when an NV center is generated in a SiC epitaxial layer of a designated region by ion implantation, a surface of a SiC epitaxial layer 501 on a SiC substrate 502 may be spin-coated with a layer of polymethyl methacrylate (PMMA) film, a corresponding shape is made by using electron-beam lithography at a position where the center is intended to be generated, and a specific dose of nitrogen ions is implanted at the position, so that a region protected by the PMMA film cannot generate the NV center. When nitrogen ions are implanted into the designated region by the ion implantation, a generated NV center density increases as a dose of implanted nitrogen ions increases, and is generally within a range of $0\text{-}10^{21}$ cm$^{-3}$. For example, when an implantation depth is 100 nm, the number of NV centers within a 1 µm junction region range of flux qubits (that is, the designated region corresponding to the flux qubits) may be controlled to be $0\text{-}10^9$.

In certain embodiment(s), a superconducting qubit corresponding to the superconducting qubit line is directly coupled to a solid-state defect qubit corresponding to the NV center; or the superconducting qubit corresponding to the superconducting qubit line is indirectly coupled to the solid-state defect qubit corresponding to the NV center.

In the embodiments of the present disclosure, the superconducting qubit line may be directly coupled to the solid-state defect qubit corresponding to the NV center through a magnetic field and in other manners; or the superconducting qubit line may be indirectly coupled to the solid-state defect qubit corresponding to the NV center through a resonant cavity and in other manners.

Because the superconducting qubit corresponding to the superconducting qubit line has better scalability, superconducting qubits corresponding to a plurality of superconducting qubit lines may be coupled through a capacitor and in other manners, to achieve multi-bit quantum computing and improve computing efficiency of the quantum computer. However, the superconducting qubit has poor coherence, and is easily affected by an environment to cause decoherence. Therefore, an effective number of quantum computing times cannot be achieved in a short coherence time.

When superconducting qubits corresponding to the superconducting qubit lines are coupled to solid-state defect qubits corresponding to NV centers, a superconducting qubit corresponding to each superconducting qubit line may be coupled to a solid-state defect qubit of an NV center corresponding to each superconducting qubit line. That is, N coupled superconducting qubits may be respectively coupled to N solid-state defect qubits (or N ensembles), and the N solid-state defect qubits (or the N ensembles) may be equivalent to functions of a register and configured to store quantum states of the N coupled superconducting qubits. The solid-state defect qubits have a longer coherence time, and data storage has a longer validity period, so that effective quantum computing is easier to achieve.

Figure 6:
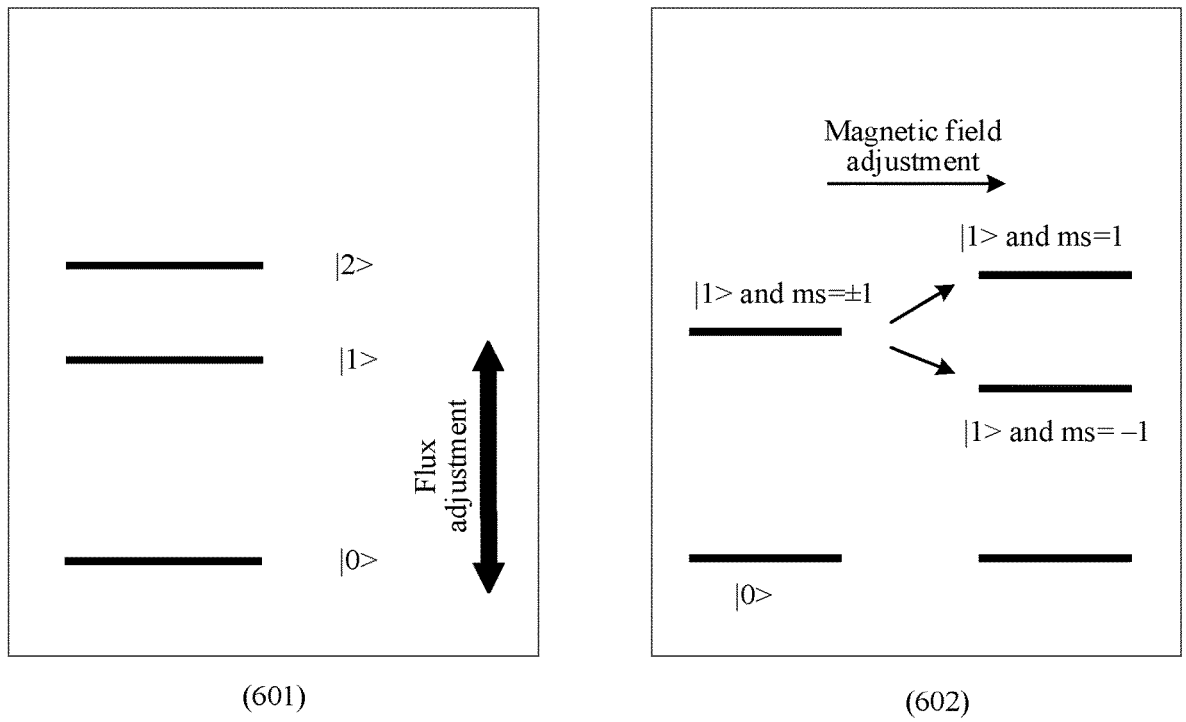
FIG. 6 is a schematic diagram of adjustment of an energy level referenced in FIG. 2 according to certain embodiment(s) of the present disclosure.

Achieving quantum state exchange between the superconducting qubits and the solid-state defect qubits may need to adjust an energy level difference corresponding to the superconducting qubits and an energy level difference between the solid-state defect qubits to be close. FIG. 6 shows a schematic diagram of adjustment of an energy level according to an embodiment of the present disclosure. For different types of superconducting qubits, the energy level may be adjusted by using different manners. By using a superconducting flux qubit as an example, a part 601 in FIG. 6 is a schematic diagram of an energy level of the flux qubit, and an energy level difference between a ground state and a first excited state corresponding to the superconducting flux qubit may be adjusted by adjusting flux passing through a superconducting qubit line. For a solid-state defect qubit, a magnetic field may be applied to an NV center to make a spin magnetic moment of the NV center interact with the magnetic field, so that a degenerate first excited state (an energy level of ms=±1) is split into two energy levels (that is, an energy level of ms=1 and an energy level of ms=−1), as shown in a part 602 of FIG. 6, and a splitting frequency may be adjusted and controlled through the magnetic field (that is, a Zeeman effect). In this embodiment, the ground state and the energy level of ms=1 may be used as the solid-state defect qubit, or the ground state and the energy level of ms=−1 may be used as the solid-state defect qubit. An energy level difference of the solid-state defect qubit and an energy level difference of the superconducting qubit are both adjustable. Therefore, when energy levels of two systems are adjusted to be close, the quantum state exchange may occur when coupling is stronger, so that a quantum hybrid system is formed.

In certain embodiment(s), when the superconducting qubit corresponding to the superconducting qubit line is either of the superconducting flux qubit and the superconducting phase qubit, the superconducting qubit corresponding to the superconducting qubit line is directly coupled to the solid-state defect qubit corresponding to the NV center; or when the superconducting qubit corresponding to the superconducting qubit line is either of the superconducting flux qubit and the superconducting phase qubit, the superconducting qubit corresponding to the superconducting qubit line is indirectly coupled to the solid-state defect qubit corresponding to the NV center.

When the superconducting qubit corresponding to the superconducting qubit line is either of the superconducting flux qubit and the superconducting phase qubit, each energy level of the superconducting qubit line is related to an electron flow in the superconducting qubit line, and a current formed by the electron in the superconducting qubit line may generate a corresponding magnetic field. When the NV center is in a range of the magnetic field corresponding to the current formed in the superconducting qubit line, a spin angular momentum of the solid-state defect qubit corresponding to the NV center may be affected by the magnetic field, thereby causing change of an energy level of the NV center, so that the solid-state defect qubit corresponding to the NV center and the superconducting qubit (that is, the superconducting flux qubit or the superconducting phase qubit) corresponding to the superconducting qubit line generate a coupling effect (that is, are directly coupled through the magnetic field).

When the superconducting qubit corresponding to the superconducting qubit line is either of the superconducting flux qubit and the superconducting phase qubit, the superconducting qubit line may alternatively be indirectly coupled to the solid-state defect qubit corresponding to the NV center through another electronic device.

In certain embodiment(s), when the superconducting qubit corresponding to the superconducting qubit line is either of the superconducting charge qubit and the superconducting transmon qubit, the superconducting qubit corresponding to the superconducting qubit line is indirectly coupled to the solid-state defect qubit corresponding to the NV center.

When the superconducting qubit corresponding to the superconducting qubit line is the superconducting charge qubit or the superconducting transmon qubit, the superconducting qubit line is not easy to be directly coupled to the solid-state defect qubit corresponding to the NV center through the magnetic field and the electric field. Therefore, the superconducting qubit line may need to be indirectly coupled to the solid-state defect qubit corresponding to the NV center through another electronic device.

In certain embodiment(s), the superconducting qubit corresponding to the superconducting qubit line is indirectly coupled to the solid-state defect qubit corresponding to the NV center through a first resonant cavity.

The superconducting qubit corresponding to the superconducting qubit line may be indirectly coupled to the solid-state defect qubit corresponding to the NV center through the first resonant cavity.

That is, while being coupled to the superconducting qubit line, the first resonant cavity may be coupled to the solid-state defect qubit corresponding to the NV center, so that the superconducting qubit corresponding to the superconducting qubit line is coupled to the solid-state defect qubit corresponding to the NV center.

In certain embodiment(s), when the superconducting qubit corresponding to the superconducting qubit line is directly coupled to the solid-state defect qubit corresponding to the NV center, a designated region is a region corresponding to the superconducting qubit line.

Figure 7:
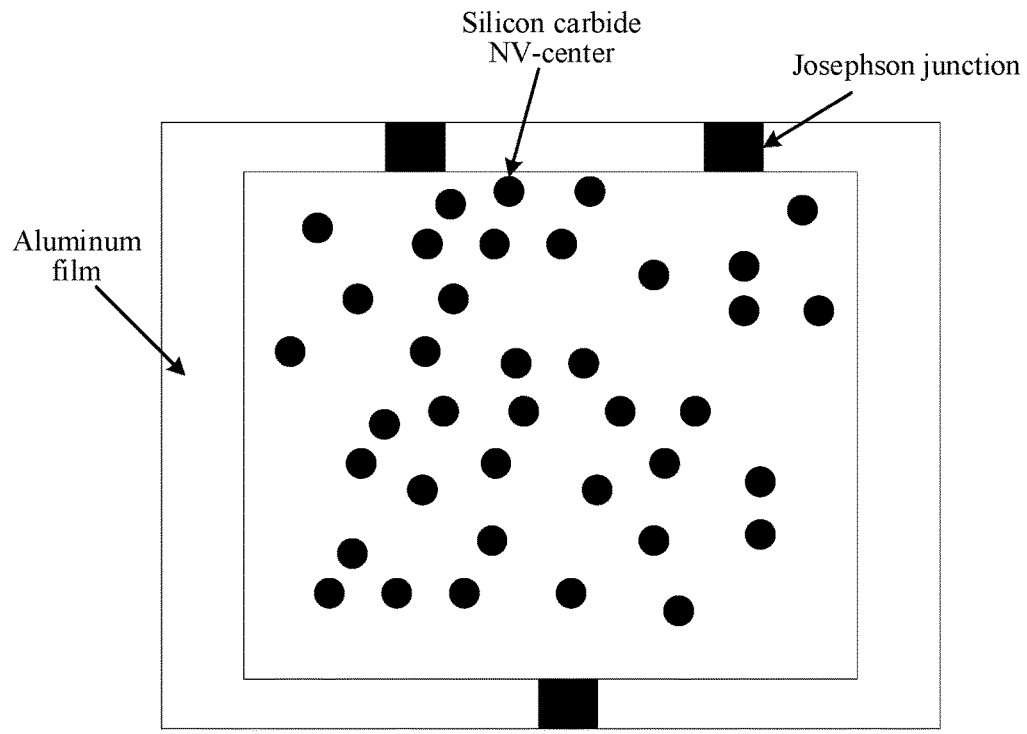
FIG. 7 is a schematic diagram of a nitrogen vacancy (NV) center of a designated region referenced in FIG. 2 according to certain embodiment(s) of the present disclosure.

When the superconducting qubit corresponding to the superconducting qubit line is directly coupled to the solid-state defect qubit corresponding to the NV center through the magnetic field, the superconducting qubit corresponding to the superconducting qubit line is the superconducting flux qubit or the superconducting phase qubit, and the designated region is a region enclosed by the superconducting qubit line. FIG. 7 shows a schematic diagram of an NV center of a designated region according to an embodiment of the present disclosure. In FIG. 7, the superconducting qubit is a superconducting flux qubit including three Josephson junctions and a superconducting line, and the designated region is a region enclosed by the Josephson junctions and the superconducting line. An NV center generated by implanting nitrogen ions into this region through the ion implantation may be directly coupled to the superconducting flux qubit.

In certain embodiment(s), when a superconducting qubit corresponding to a superconducting qubit line is indirectly coupled to a solid-state defect qubit corresponding to an NV center through a first resonant cavity, a designated region is a region corresponding to the first resonant cavity.

When the superconducting qubit corresponding to the superconducting qubit line is indirectly coupled to the solid-state defect qubit corresponding to the NV center through the first resonant cavity, the designated region is an epitaxial layer region at a center of the first resonant cavity.

Figure 8:
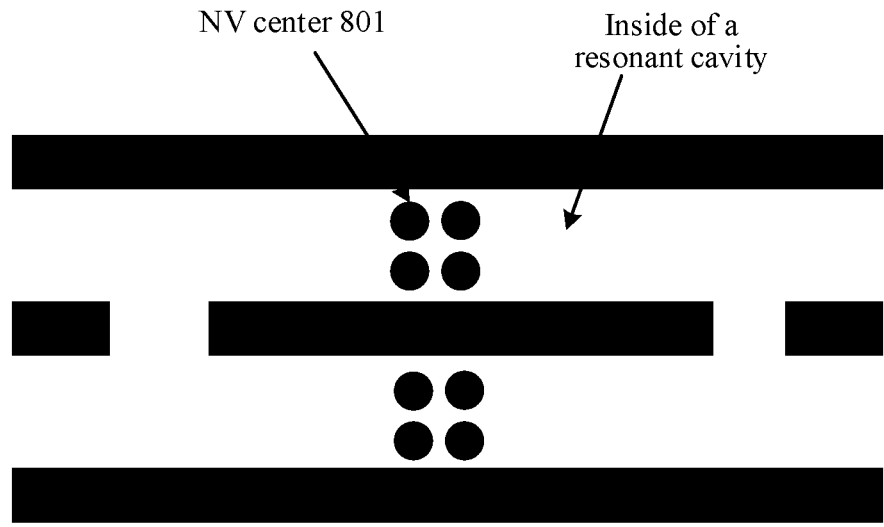
FIG. 8 is a schematic diagram of an NV center of a designated region referenced in FIG. 2 according to certain embodiment(s) of the present disclosure.

In the resonant cavity, a central region (or a voltage wave junction) of the resonant cavity has the largest current and the largest magnetic field. Therefore, to ensure coupling strength between the resonant cavity and the solid-state defect qubit corresponding to the NV center, the center of the resonant cavity is determined as the designated region, and nitrogen ions are implanted into the designated region. FIG. 8 shows a schematic diagram of an NV center of a designated region according to an embodiment of the present disclosure. As shown in FIG. 8, coupling strength between a solid-state defect qubit corresponding to an NV center 801 formed by implanting nitrogen ions into a central region of the resonant cavity and the resonant cavity that are coupled through a magnetic field is the largest. Therefore, coupling strength between the central region (that is, a target region) and the superconducting qubit line is also the largest.

In the solutions shown in the embodiments of the present disclosure, in the superconducting quantum hybrid system, the NV center is formed in the designated region of the SiC epitaxial layer by the ion implantation, and the solid-state defect qubit corresponding to the NV center is coupled to the superconducting qubit corresponding to the superconducting qubit line. Through the above solution, the ion implantation by which the NV center is formed can control the positions and number of formed NV centers, to help control the coupling between the solid-state defect qubit corresponding to the NV center and the superconducting qubit corresponding to the superconducting qubit line. In this way, a superconducting qubit with a short coherence time is easier to achieve quantum state exchange with a solid-state defect qubit with a long coherence time, that is, the superconducting qubit with the short coherence time can store information into the solid-state defect qubit with the long coherence time, so that the decoherence time of the information is increased, and the effective number of quantum computing operations are easier to achieve within the coherence time.

Figure 9:
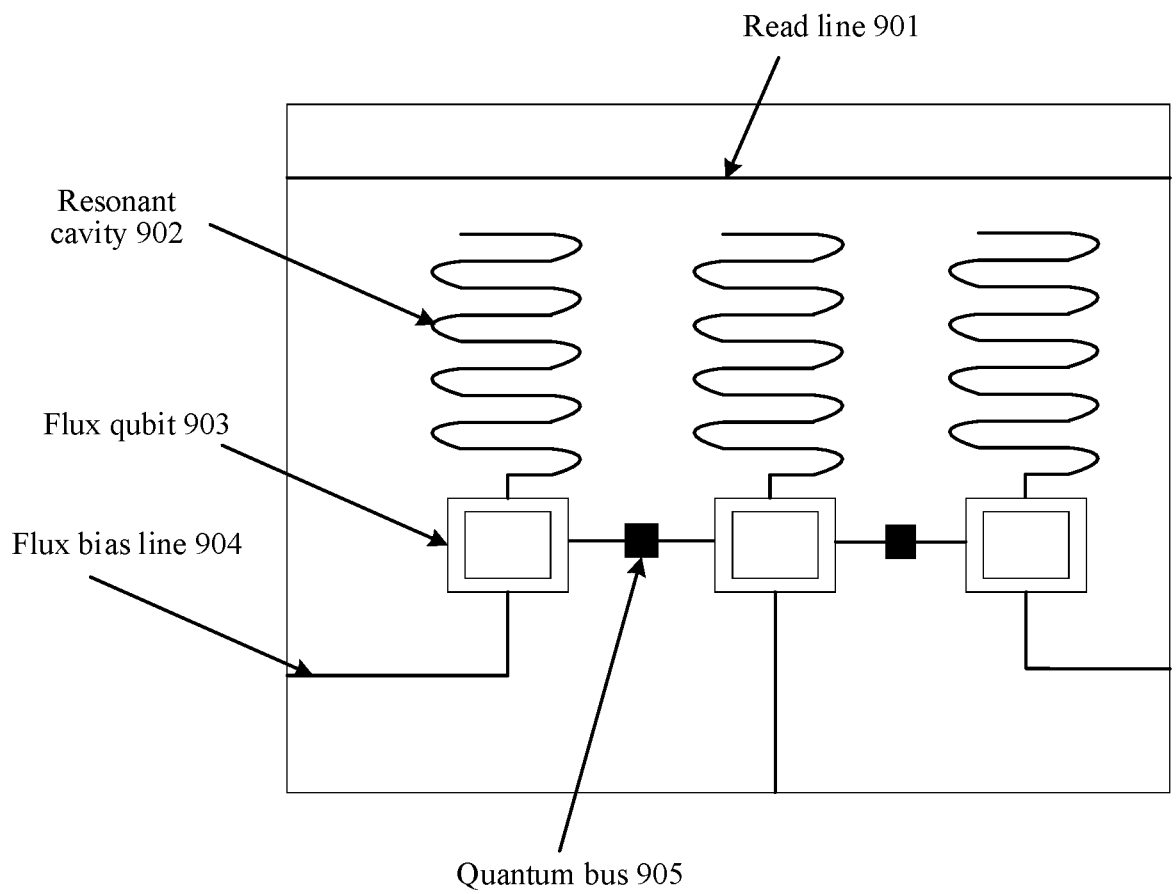
FIG. 9 is a schematic diagram of a hybrid quantum system of a superconducting qubit and an NV center according to certain embodiment(s) of the present disclosure.

FIG. 9 is a schematic diagram of a hybrid quantum system of a superconducting qubit and an NV center according to an exemplary embodiment. By using the superconducting qubit being a superconducting flux qubit as an example, the hybrid system includes a read line 901, a resonant cavity 902, a junction region part of a flux qubit 903, and a flux bias line 904, and bits are coupled to each other through a quantum bus 905. The flux bias line 904 is configured to adjust a bit frequency of the flux qubit so that the flux qubit resonates with an NV center.

In the embodiments of the present disclosure, the NV center is located in the superconducting qubit line corresponding to the superconducting qubit, and is directly coupled to the superconducting flux qubit through a magnetic field.

Figure 10:
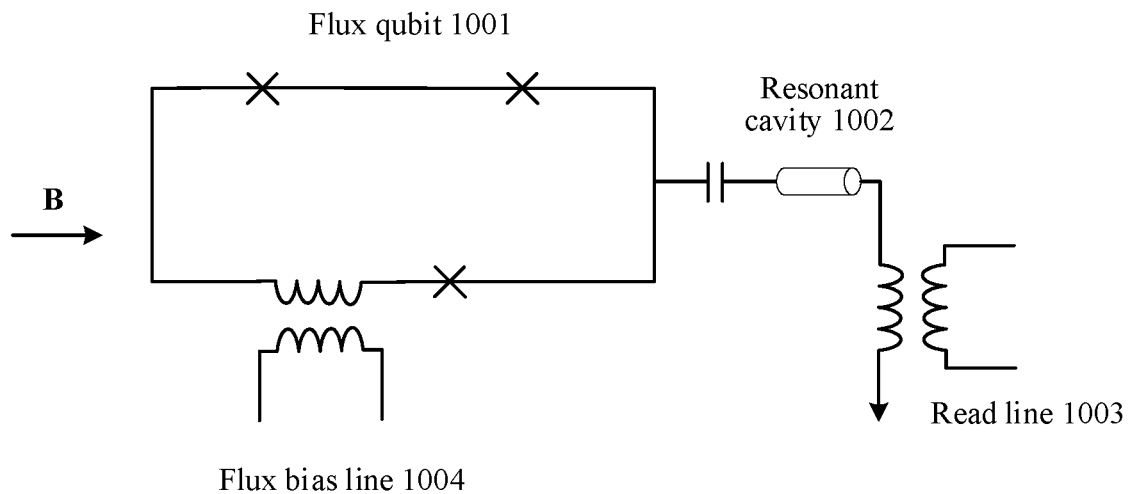
FIG. 10 is a simple circuit diagram of a hybrid quantum system of a superconducting qubit and an NV center according to certain embodiment(s) of the present disclosure.

FIG. 10 shows a simple circuit diagram of a hybrid quantum system of a superconducting qubit and an NV center. As shown in FIG. 10, when a process of reading a flux qubit through a resonant cavity is considered, a flux qubit 1001 and a resonant cavity 1002 are coupled through a capacitor $C_{gr}$ (that is, an equivalent capacitor between the flux qubit 1001 and the resonant cavity 1002). When a difference between a bit frequency and a frequency of the resonant cavity is larger, a Hamiltonian of the system is:

$$\mathcal{H}/\hbar = \omega_q \hat{\delta}_z/2 + \omega_r(\hat{n}+\tfrac{1}{2}) + 2\chi(\hat{n}+\tfrac{1}{2})\hat{\delta}_z/2$$

$\hat{\delta}_z$ is a principal quantum number operator of the flux qubit 1001, and when the operator acts on an energy eigenstate of the system, an energy level of the flux qubit corresponding to the system may be obtained; $\omega_q$ is an angular frequency of a bit, and may be adjusted through a flux $\Phi$; $\omega_r$ is an angular frequency of the resonant cavity; $\hat{n}$ is a photon number operator of the resonant cavity, configured to read a photon number of the resonant cavity in the energy eigenstate of the system (that is, an energy level of the resonant cavity); $2\chi(\hat{n}+\tfrac{1}{2})\hat{\delta}_z/2$ is a coupling term between the resonant cavity and the flux qubit; and $\chi$ is an offset of the resonant cavity when the bit is in a different state. A read line 1003 and the resonant cavity 1002 are coupled through an inductor, and a state of the bit is analyzed by measuring the frequency of the resonant cavity. A flux bias line 1004 is configured to form an equivalent flux $\Phi$ in a rectangular junction region through inductive coupling, thereby adjusting the bit frequency.

A ground state spin of an electron spin of an NV center in 4H—SiC is 1, and a Hamiltonian $\mathcal{H}$ of an entire spin may be written as:

$$\mathcal{H}/\hbar = D\left[S_z^2 - \frac{S(S+1)}{3}\right] + E(S_x^2 - S_y^2) + g\mu_B B S_z$$

D and E are axial symmetry and anisotropy constants of zero-field splitting, and $\hbar$ is a reduced Planck constant; $S_x$, $S_y$, $S_z$ are Pauli operators with a spin of 1, and S is a spin quantum number operator; and g=2 is an electron g factor, $\mu_B$ is a Bohr magneton, and B is an applied magnetic field. For example, a zero-field component D of the NV center is generally at 1.33 GHz. If the magnetic field B is applied, $m_s=\pm 1$ may be split at a slope of 2.8 MHz/G. Therefore, the magnetic field B may directly adjust and control an energy level of the NV center. For the flux qubit, an energy level difference between 0 and 1 may be adjusted by adjusting a flux in the junction region. Therefore, energy levels of two systems may be adjusted.

The adjustable magnetic field B may enable an energy level of an original first excited state of the NV center to be split into an energy level with a spin of 1 and an energy level with a spin of −1, and a splitting frequency may be controlled according to the magnetic field B. Therefore, a ground state of the NV center and the energy level with the spin of 1 may be used as a solid-state defect qubit of the NV center, or the ground state of the NV center and the energy level with the spin of −1 may be used as the solid-state defect qubit of the NV center.

An energy level difference between the ground state and the first excited state of the superconducting flux qubit may be adjusted through the flux bias line 1004. When adjustment and control of at least one of the flux bias line 1004 and the magnetic field B enable the energy level difference of the superconducting flux qubit and an energy level difference of the solid-state defect qubit of the NV center to be close, energy level exchange between the NV center and the superconducting flux qubit may occur, so that information of a superconducting flux qubit with a short coherence time is stored in a solid-state defect qubit with a long coherence time.

Coupling strength (that is, a frequency at which energy level exchange occurs) between a single NV center and a flux qubit (which a side length of a junction region is approximately 1 μm, and a critical current $I_c$ is approximately 0.5 μA) is roughly at 10 kHz. In this embodiment, a time of energy level exchange is about 0.1 ms, and is much greater than a coherence time of the superconducting flux qubit. In such strength, it is difficult to demonstrate any substantial quantum state exchange under the related technology. A method that an ensemble replaces the single NV center may be used, because coupling strength is roughly directly proportional to $\sqrt{N}$, where N is the number of NV centers coupled to flux qubits. In this embodiment, a Hamiltonian of the hybrid system is:

$$\mathcal{H}/\hbar = \left(\frac{\epsilon}{2}\sigma_z + \lambda\sigma_x\right) + \sum_{i=1}^{i=N} D\left[S_{z,i}^2 - \frac{S(S+1)}{3}\right] + \sum_{i=1}^{i=N} E(S_{x,i}^2 - S_{y,i}^2) + \sum_{i=1}^{i=N} g_i \sigma_z S_{x,i}$$

$\epsilon$ is an energy bias, which is related to a flux $\Phi$. $\lambda$ is tunneling strength. In the Hamiltonian, a first item is a bit, two middle items are ensemble NV centers, and a last item is a coupling item. Because the number of NV centers coupled to the flux qubits is N, last three items are a sum of N NV centers. The number of NV centers may be controlled to be 0-$10^9$ by controlling ion implantation. In this way, the coupling strength may alternatively be at 10 kHz to 316 MHz. When the coupling strength reaches an order of tens of MHz, quantum state exchange between the two systems may be easier to achieve by demonstrating Rabi oscillation.

The flux qubit in the embodiments of the present disclosure may alternatively be replaced with any one of the superconducting charge qubit, the superconducting transmon qubit, and the superconducting phase qubit, and the superconducting qubit line corresponding to the qubit may be correspondingly replaced. The replaced superconducting qubit may also achieve energy level adjustment through a corresponding manner, to achieve the quantum state exchange with the NV center.

In an exemplary embodiment, the present disclosure further provides a quantum chip, including at least one superconducting quantum hybrid system shown in the above embodiments.

In an exemplary embodiment, the present disclosure further provides a computer device, including at least one quantum chip.

In certain embodiment(s), the term "computer device" is interchangeable with the term "computing device."

In an exemplary embodiment, the present disclosure further provides a computer device, including at least one superconducting quantum hybrid system shown in the above embodiments.

The superconducting quantum hybrid system in the embodiments of the present disclosure may be applied to a quantum computer or a quantum computing platform.

Figure 11:
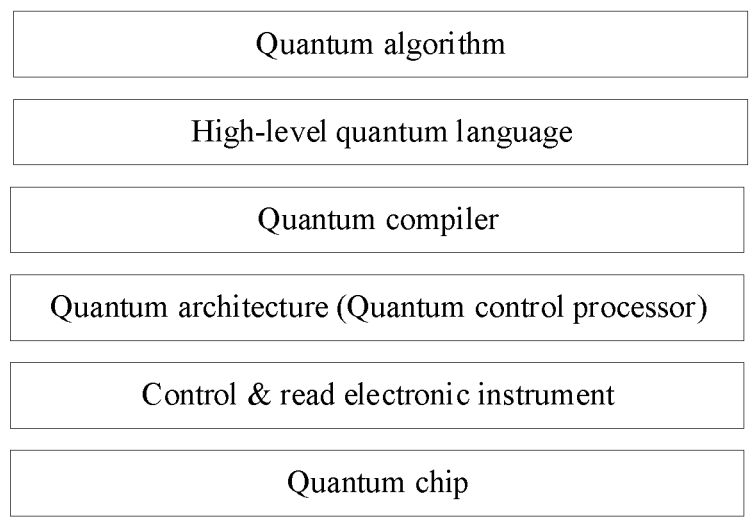
FIG. 11 is a schematic structural block diagram of a full-stack programmable quantum computer according to certain embodiment(s) of the present disclosure.

For example, FIG. 11 is a structural block diagram of a full-stack programmable quantum computer according to an exemplary embodiment of the present disclosure. A top layer includes a quantum algorithm, a high-level quantum language, and a quantum compiler, and a bottom layer is a quantum chip (namely, the quantum chip including the superconducting quantum hybrid system in the above embodiments of the present disclosure, which may also be referred to as a quantum circuit). To connect the top layer and the bottom layer together, similar to a classical computer, there is a quantum architecture in a middle layer. In such a full-stack programmable quantum computer, the quantum architecture (including a quantum instruction set and a quantum control microarchitecture) plays an important role in communicating between quantum software and quantum hardware, and may need to provide functions such as program flow control, feedback control, and precise sequential gate operation sequence control.

In a specific implementation, the quantum instruction set is generated by the compiler, and the quantum control microarchitecture is implemented as a quantum control processor (QCP) in hardware, and controls the quantum chip by executing the quantum instruction set. An output of the QCP ultimately controls a series of analog instruments (that is, a control & read electronic instrument shown in FIG. 11). For example, in a hybrid quantum computing system, the analog instrument herein can convert digital signals into analog microwave waveforms, to control the quantum chip.

Figure 12:
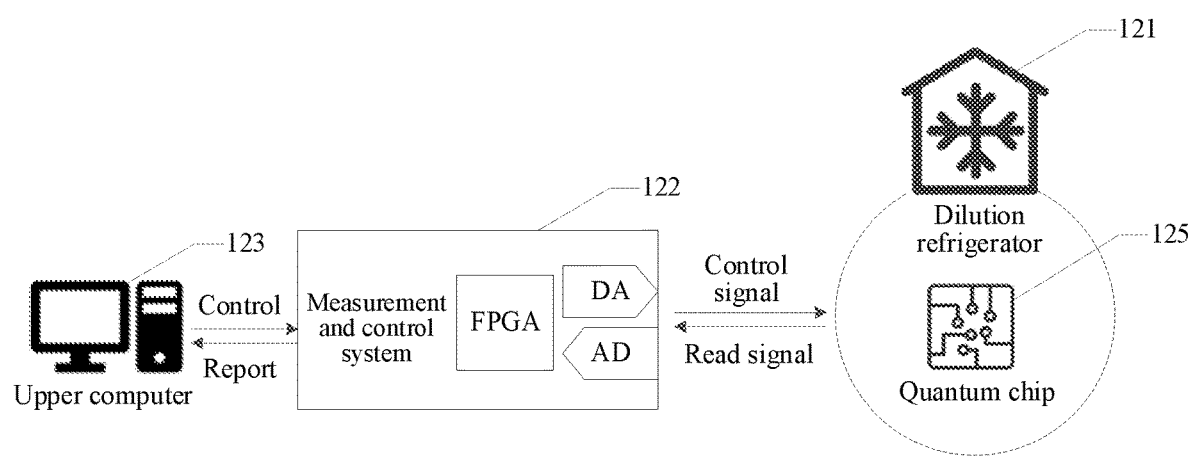
FIG. 12 is a schematic architectural diagram of a quantum computing platform according to certain embodiment(s) of the present disclosure.

FIG. 12 is a schematic architectural diagram of a quantum computing platform according to an exemplary embodiment of the present disclosure. The rightmost one in FIG. 12 is a dilution refrigerator 121, configured to provide a working environment for a quantum chip 125 (such as the quantum chip including the superconducting quantum hybrid system in the above embodiments of the present disclosure). The quantum chip 125 may work at a temperature of 10 mK. The quantum chip 125 is controlled by analog waveforms. Therefore, a measurement and control system 122 including a field programmable gate array (FPGA) and an analog-to-digital converter (ADC)/digital-to-analog converter (DAC) may be required to provide control and measurement. The measurement and control system 122 is also controlled by measurement and control software of an upper computer 123, and the measurement and control software may determine an operation that may need to be performed at present, and operate and configure the measurement and control system 122. The upper computer 123 may be a classical computer such as a personal computer (PC).

Other embodiments of the present disclosure will be apparent to a person skilled in the art from consideration of the present disclosure and practice of the disclosure here. The present disclosure is intended to cover any variations, uses or adaptive changes of the present disclosure. Such variations, uses or adaptive changes follow the general principles of the present disclosure, and include well-known knowledge and certain existing technical means in the art that are not disclosed in the present disclosure. The present disclosure and the embodiments are considered as merely exemplary, and the scope and spirit of the present disclosure are pointed out in the following claims.

The present disclosure is not limited to the precise structures described above and shown in the accompanying drawings, and various modifications and changes can be made without departing from the scope of the present disclosure. The scope of the present disclosure is subject only to the appended claims.

What is claimed is:

1. A superconducting quantum hybrid system, comprising:
   a silicon carbide (SiC) epitaxial layer; and
   a superconducting qubit line, the superconducting qubit line corresponding to a superconducting qubit,
   wherein a designated region of the SiC epitaxial layer includes a nitrogen vacancy (NV) center, the NV center being formed by implanting nitrogen ions into the designated region of the SiC epitaxial layer, and
   wherein the superconducting qubit line is located on a surface of the SiC epitaxial layer, the superconducting qubit is coupled to a solid-state defect qubit, and the solid-state defect qubit is a qubit corresponding to the NV center in the designated region.

2. The superconducting quantum hybrid system according to claim 1, wherein the superconducting qubit is a superconducting flux qubit, a superconducting charge qubit, a superconducting transmon qubit, or a superconducting phase qubit.

3. The superconducting quantum hybrid system according to claim 2, further comprising:
   a first resonant cavity coupled to the superconducting qubit line.

4. The superconducting quantum hybrid system according to claim 3, wherein the first resonant cavity is coupled to the superconducting qubit line at a designated position, and the designated position is determined according to a type of the superconducting qubit line.

5. The superconducting quantum hybrid system according to claim 4, wherein the first resonant cavity is coupled to the superconducting qubit line through a capacitor at the designated position.

6. The superconducting quantum hybrid system according to claim 1, wherein the superconducting qubit is directly coupled to the solid-state defect qubit, or the superconducting qubit is indirectly coupled to the solid-state defect qubit.

7. The superconducting quantum hybrid system according to claim 6, wherein
   the superconducting qubit is the superconducting flux qubit or the superconducting phase qubit, and the superconducting qubit is directly coupled to the solid-state defect qubit, or
   the superconducting qubit is the superconducting flux qubit or the superconducting phase qubit, and the superconducting qubit is indirectly coupled to the solid-state defect qubit.

8. The superconducting quantum hybrid system according to claim 6, wherein the superconducting qubit is a superconducting charge qubit or a superconducting transmon qubit, and the superconducting qubit is indirectly coupled to the solid-state defect qubit.

9. The superconducting quantum hybrid system according to claim 3, wherein the superconducting qubit is indirectly coupled to the solid-state defect qubit through the first resonant cavity.

10. The superconducting quantum hybrid system according to claim 9, wherein in response to determining that the superconducting qubit is indirectly coupled to the solid-state defect qubit through the first resonant cavity, the designated region is a region corresponding to the first resonant cavity.

11. The superconducting quantum hybrid system according to claim 6, wherein the superconducting qubit is directly coupled to the solid-state defect qubit, the designated region is a region corresponding to the superconducting qubit line.

12. The superconducting quantum hybrid system according to claim 3, further comprising a read line, wherein the read line is coupled to the first resonant cavity through a first capacitor or a first inductor.

13. The superconducting quantum hybrid system according to claim 1, wherein the number of NV centers of the designated region is determined according to concentration of nitrogen ions implanted into the SiC epitaxial layer of the designated region.

14. The superconducting quantum hybrid system according to claim 1, wherein the superconducting quantum hybrid system comprises at least two superconducting qubit lines, and the at least two superconducting qubit lines are coupled through a quantum bus.

15. A quantum chip, comprising: a superconducting quantum hybrid system, wherein the superconducting quantum hybrid system includes:
    a silicon carbide (SiC) epitaxial layer; and
    a superconducting qubit line, the superconducting qubit line corresponding to a superconducting qubit,
    wherein a designated region of the SiC epitaxial layer includes a nitrogen vacancy (NV) center, the NV center being formed by implanting nitrogen ions into the designated region of the SiC epitaxial layer, and
    wherein the superconducting qubit line is located on a surface of the SiC epitaxial layer, the superconducting qubit is coupled to a solid-state defect qubit, and the solid-state defect qubit is a qubit corresponding to the NV center in the designated region.

16. The quantum chip according to claim 15, wherein the superconducting qubit is a superconducting flux qubit, a superconducting charge qubit, a superconducting transmon qubit, or a superconducting phase qubit.

17. The quantum chip according to claim 16, further comprising:
    a first resonant cavity coupled to the superconducting qubit line.

18. The quantum chip according to claim 15, wherein
    the superconducting qubit is the superconducting flux qubit or the superconducting phase qubit, and the superconducting qubit is directly coupled to the solid-state defect qubit, or
    the superconducting qubit is the superconducting flux qubit or the superconducting phase qubit, and the superconducting qubit is indirectly coupled to the solid-state defect qubit.

19. A computing device, comprising: a superconducting quantum hybrid system, wherein the superconducting quantum hybrid system includes:
    a silicon carbide (SiC) epitaxial layer; and
    a superconducting qubit line, the superconducting qubit line corresponding to a superconducting qubit,
    wherein a designated region of the SiC epitaxial layer includes a nitrogen vacancy (NV) center, the NV center being formed by implanting nitrogen ions into the designated region of the SiC epitaxial layer, and
    wherein the superconducting qubit line is located on a surface of the SiC epitaxial layer, the superconducting qubit is coupled to a solid-state defect qubit, and the solid-state defect qubit is a qubit corresponding to the NV center in the designated region.

20. The computing device according to claim 19, wherein the superconducting qubit is a superconducting flux qubit, a superconducting charge qubit, a superconducting transmon qubit, or a superconducting phase qubit.

\* \* \* \* \*